United States Patent
Dudha et al.

(10) Patent No.: US 10,726,175 B1
(45) Date of Patent: Jul. 28, 2020

(54) SYSTEMS FOR OPTIMIZATION OF READ-ONLY MEMORY (ROM)

(71) Applicant: Xilinx, Inc., San Jose, CA (US)

(72) Inventors: Chaithanya Dudha, San Jose, CA (US); Satyaprakash Pareek, San Jose, CA (US); Bing Tian, San Jose, CA (US); Ashish Sirasao, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 16/291,952

(22) Filed: Mar. 4, 2019

(51) Int. Cl.
| G06F 30/30 | (2020.01) |
| H01L 27/02 | (2006.01) |
| G06F 30/327 | (2020.01) |
| G06F 30/398 | (2020.01) |
| G06F 30/00 | (2020.01) |

(52) U.S. Cl.
CPC .......... *G06F 30/327* (2020.01); *G06F 30/398* (2020.01); *H01L 27/0207* (2013.01)

(58) Field of Classification Search
CPC ... G06F 30/398; G06F 30/327; H01L 27/0207
USPC ......................................... 716/101, 104, 132
See application file for complete search history.

(56) References Cited

U.S. PATENT DOCUMENTS

| | | | | |
|---|---|---|---|---|
| 4,482,974 A * | 11/1984 | Kovalick | .............. | G06F 1/0356 327/106 |
| 5,317,755 A * | 5/1994 | Hartley et al. | ...... | G06F 15/8046 341/101 |
| 5,606,697 A * | 2/1997 | Ono | ........................ | G06F 8/443 717/147 |
| 5,825,921 A * | 10/1998 | Dulong | ................ | G06K 9/6297 382/181 |
| 6,298,472 B1 * | 10/2001 | Phillips et al. | ......... | G06F 30/30 716/105 |
| 7,673,257 B1 * | 3/2010 | Bains et al. | .......... | G06F 7/5443 716/104 |
| 8,042,082 B2 * | 10/2011 | Solomon | ........... | H01L 27/11807 716/116 |
| 9,553,590 B1 * | 1/2017 | Manohararajah et al. | ................... | H03K 19/1737 |
| 9,852,250 B2 * | 12/2017 | Subramaniam et al. | ..................... | G06F 30/20 |
| 10,452,392 B1 * | 10/2019 | Lewis et al. | .............. | G06F 9/30 |
| 2008/0104566 A1 * | 5/2008 | Avss et al. | .............. | G06F 30/30 326/101 |

* cited by examiner

*Primary Examiner* — Sun J Lin
(74) *Attorney, Agent, or Firm* — Haynes and Boone, LLP

(57) ABSTRACT

A memory optimization method includes identifying, within a circuit design, a memory having an arithmetic operator at an output side and/or an input side of the memory. The memory may include a read-only memory (ROM). In some examples, an input of the arithmetic operator includes a constant value. In some embodiments, the memory optimization method further includes absorbing a function of the arithmetic operator into the memory. By way of example, the absorbing the function includes modifying contents of the memory based on the function of the arithmetic operator to provide an updated memory and removing the arithmetic operator from the circuit design.

20 Claims, 8 Drawing Sheets

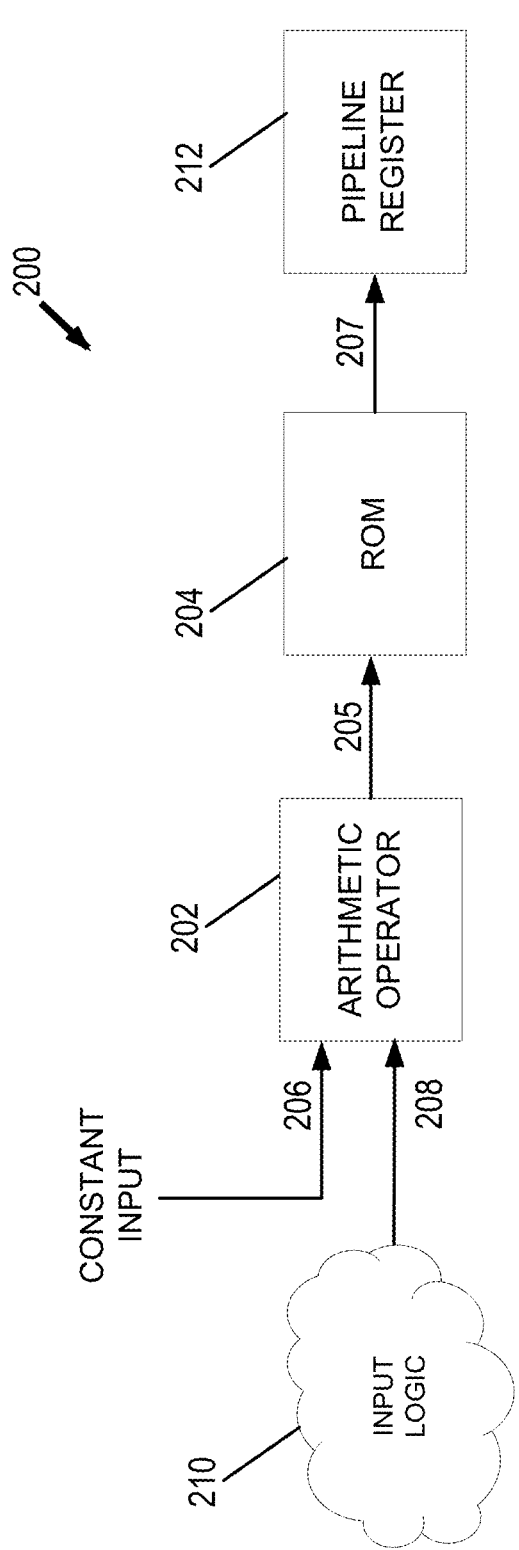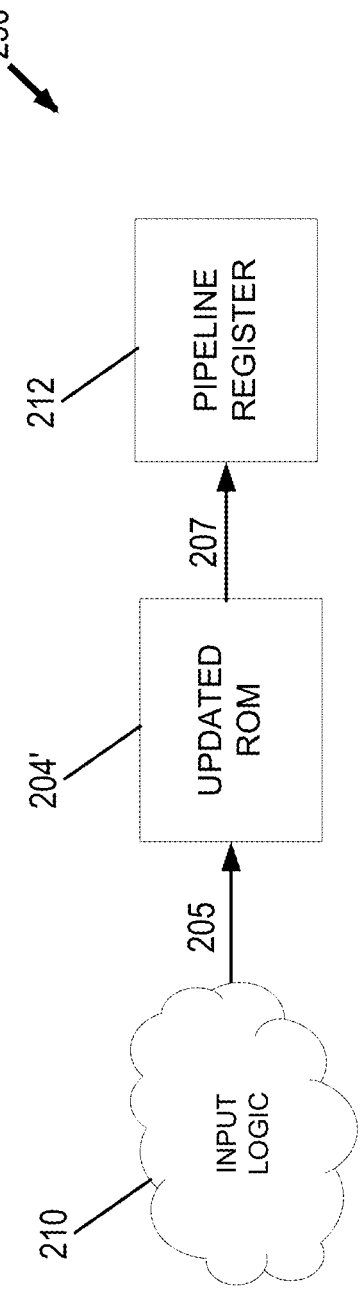
FIG. 2A
FIG. 2B

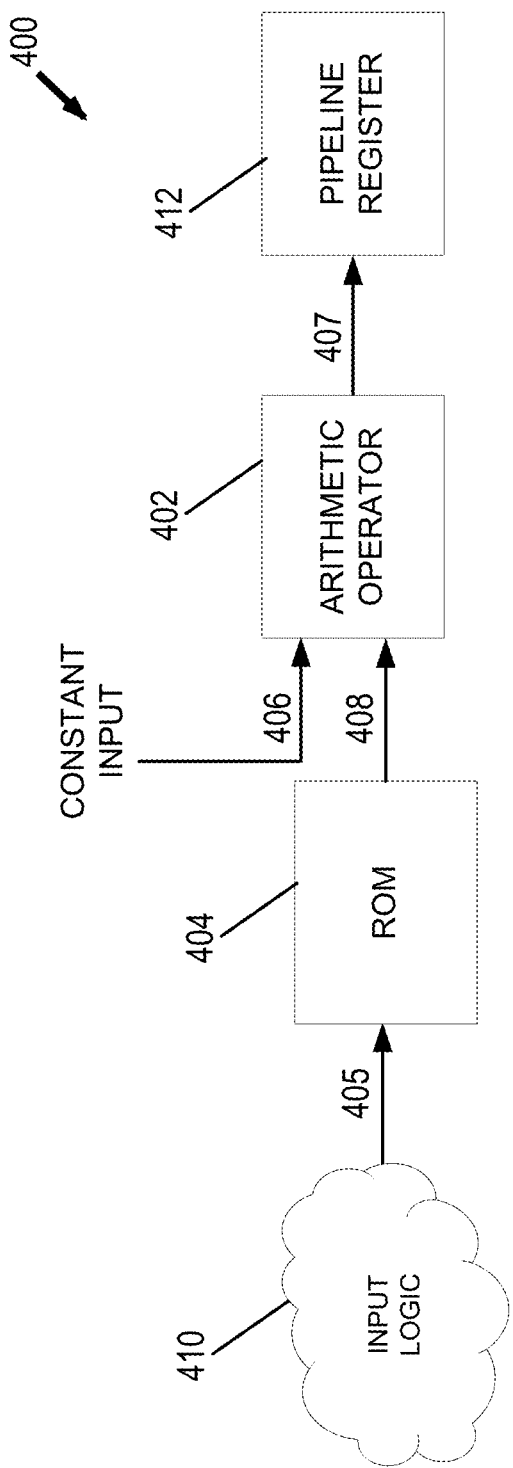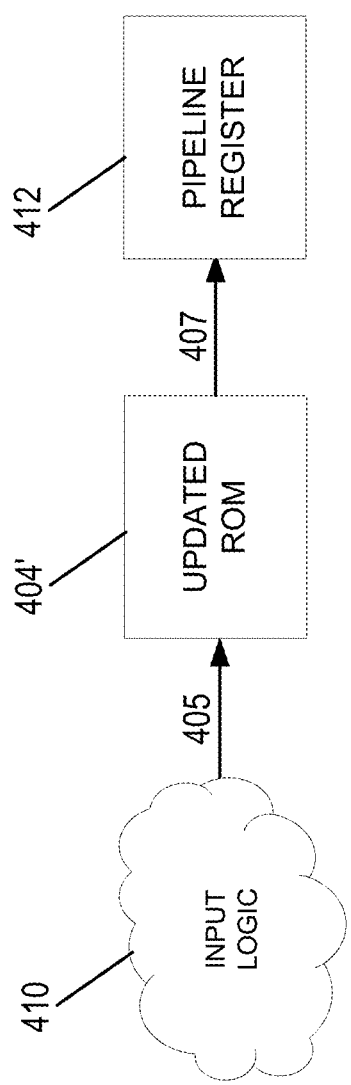
FIG. 4A
FIG. 4B

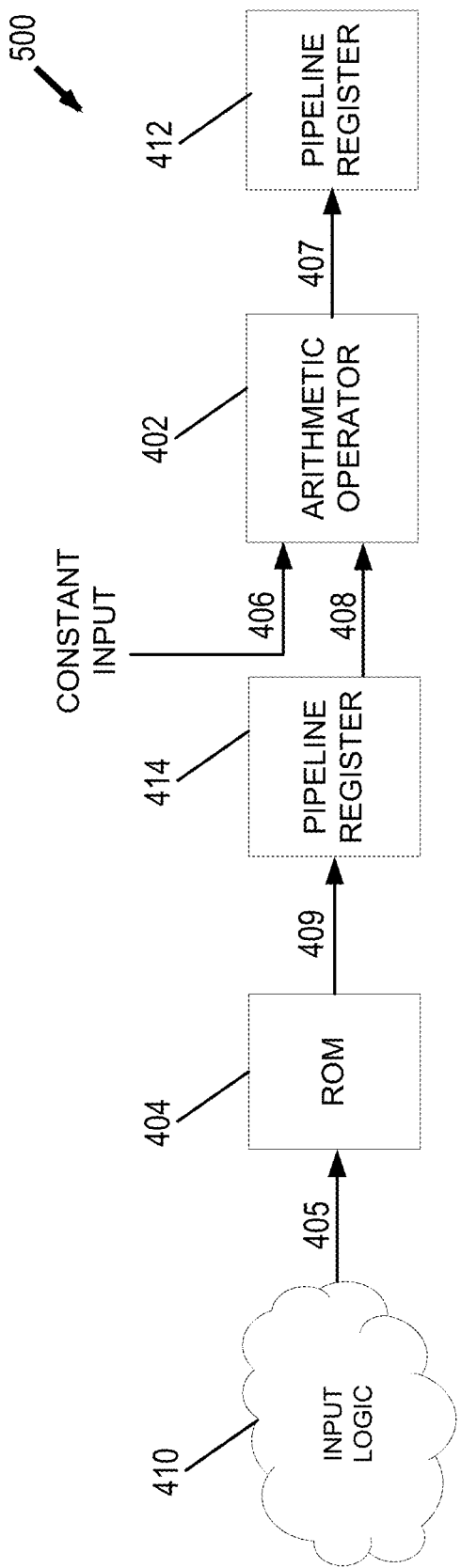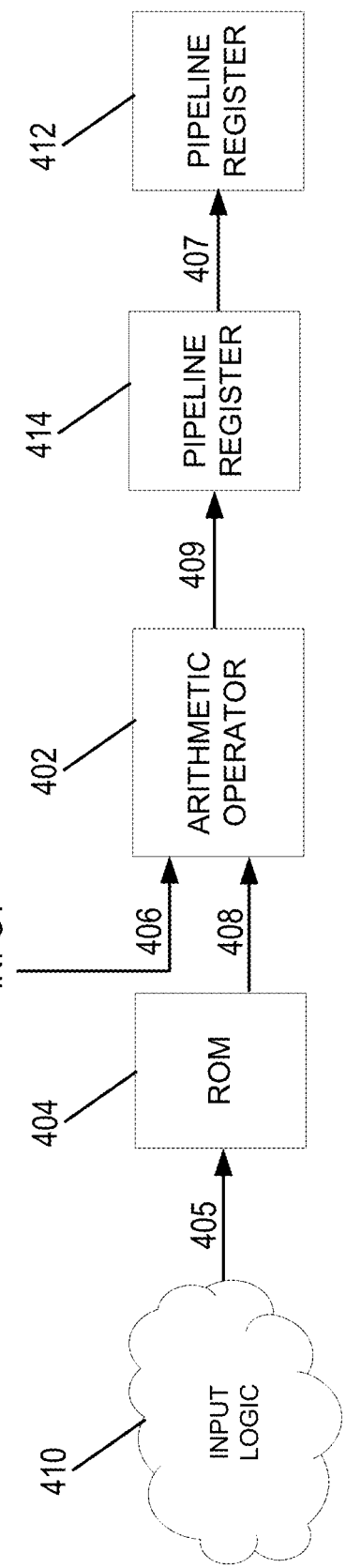
FIG. 5A
FIG. 5B

US 10,726,175 B1

SYSTEMS FOR OPTIMIZATION OF READ-ONLY MEMORY (ROM)

FIELD

Examples of the present disclosure generally relate to integrated circuits (ICs) and, in particular, to an embodiment related to systems providing optimization of read-only memory.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to design and manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling alone has not been sufficient to achieve at least some performance goals.

As one example, non-volatile memories have become a critical component of IC designs. One type of non-volatile memory includes a read-only memory (ROM), such as a programmable ROM (PROM), an erasable PROM (EPROM), an electrically erasable PROM (EEPROM), or FLASH memory, among others. In various cases, a ROM may be mapped to look up tables (LUTs) or to dedicated random-access memory blocks (BRAMs). However, using LUTs comes at a cost of using logic cells needed to implement logic circuits, thus LUTs are generally used for smaller memories. BRAMS, on the other hand, may generally be used to instantiate large, registered ROMs. With respect to ROM performance, if a ROM drives an arithmetic operator, or if a ROM address is driven by an arithmetic operator, performance (e.g., maximum operating frequency (FMax)) may be degraded. Also, and in some cases, the amount of IC area occupied by such ROM and arithmetic operator structures may present additional design and/or performance challenges.

Accordingly, there is a need for improved systems providing optimization of read-only memory.

SUMMARY

In some embodiments in accordance with the present disclosure, a memory optimization method includes identifying, within a circuit design, a memory having an arithmetic operator at an output side of the memory. In some examples, a first input of the arithmetic operator includes a constant value. In some embodiments, the memory optimization method further includes absorbing a function of the arithmetic operator into the memory. By way of example, the absorbing the function includes modifying contents of the memory based on the function of the arithmetic operator to provide an updated memory and removing the arithmetic operator from the circuit design.

In some embodiments, the identifying further includes identifying that the memory drives a second input of the arithmetic operator.

In some embodiments, the identifying further includes identifying that the memory drives one or more registers and identifying that the one or more registers drive a second input of the arithmetic operator.

In some embodiments, the memory optimization method further includes based on the identifying, performing a forward retiming of the one or more registers to modify the circuit design so that the memory drives the second input of the arithmetic operator. In some cases, after the performing the forward retiming, the memory optimization method further includes absorbing the function of the arithmetic operator into the memory.

In some embodiments, the memory optimization method further includes determining whether an output of the arithmetic operator is registered or whether an address of the memory is registered.

In some embodiments, the memory optimization method further includes based on the determining, evaluating a memory mapping cost function, where the memory mapping cost function is determined based on a width of the updated memory, a depth of the updated memory, and a sparseness of the updated memory.

In some embodiments, the memory optimization method further includes based on the evaluating the memory mapping cost function, mapping the updated memory to a dedicated random-access memory block (BRAM), where the mapping the updated memory to the BRAM includes absorbing the function of the arithmetic operator into the memory.

In some embodiments in accordance with the present disclosure, a memory output optimization method includes identifying a circuit design including a data pipeline having a first stage that includes a read-only memory (ROM) and a second stage that includes an arithmetic operator. In some examples, the arithmetic operator has a first input that includes a constant value, and the second stage is disposed at an output side of the first stage. In some embodiments, the memory output optimization method further includes modifying each word of a memory array of the ROM based on a function of the arithmetic operator to provide an updated ROM and removing the arithmetic operator from the circuit design.

In some embodiments, the identifying further includes identifying the data pipeline having a third stage disposed between the first stage and the second stage, where the third stage includes a register, and where the register drives a second input of the arithmetic operator.

In some embodiments, the memory output optimization method further includes based on the identifying, performing a forward retiming of the register to modify the circuit design so that the ROM drives the second input of the arithmetic operator, and after the performing the forward retiming, modifying each word of the memory array of the ROM and removing the arithmetic operator from the circuit design.

In some embodiments, the forward retiming further modifies the circuit design so that the arithmetic operator drives the register, and the removing the arithmetic operator from the circuit design further includes modifying the circuit design so that the updated ROM drives the register.

In some embodiments, the memory output optimization method further includes after performing the forward retiming and before modifying each word of the memory array of the ROM, evaluating a memory mapping cost function.

In some embodiments, the memory mapping cost function is determined based on a width of the updated ROM, a depth of the updated ROM, and a sparseness of the updated ROM.

In some embodiments, the memory output optimization method further includes based on the evaluating the memory mapping cost function, mapping the updated ROM to a dedicated random-access memory block (BRAM).

In some embodiments in accordance with the present disclosure, a memory input optimization method includes identifying a data pipeline within a circuit design, where the data pipeline includes an arithmetic operator at an input side of a read-only memory (ROM), and where a first input of the arithmetic operator includes a constant value. In some embodiments, the memory input optimization method further includes absorbing a function of the arithmetic operator into the ROM. By way of example, the absorbing the function includes modifying contents of the ROM based on the function of the arithmetic operator to provide an updated ROM and removing the arithmetic operator from the data pipeline.

In some embodiments, the identifying further includes identifying that the arithmetic operator drives an address input of the ROM.

In some embodiments, the identifying further includes identifying that the arithmetic operator drives one or more registers and identifying that the one or more registers drive an address input of the ROM.

In some embodiments, the memory input optimization method further includes based on the identifying, performing a backward retiming of the one or more registers to modify the circuit design so that the arithmetic operator drives the address input of the ROM. In various examples, the memory input optimization method further includes after the performing the backward retiming, absorbing the function of the arithmetic operator into the ROM.

In some embodiments, the modifying the contents of the ROM further includes shifting an address location by the constant value to a shifted address location, and the modifying the contents of the ROM further includes retrieving data from the shifted address location. In some embodiments, the memory input optimization method further includes storing the retrieved data into the address location.

In some embodiments, the memory input optimization method further includes before absorbing the function of the arithmetic operator into the ROM, evaluating a memory mapping cost function, where the memory mapping cost function is determined based on a width of the updated ROM, a depth of the updated ROM, and a sparseness of the updated ROM.

Other aspects and features will be evident from reading the following detailed description and accompanying drawings.

BRIEF DESCRIPTION OF THE DRAWINGS

FIG. 2A illustrates a block diagram of a circuit structure including an arithmetic operator that drives an address input of a ROM, according to some embodiments.

FIG. 2B illustrates a block diagram of an optimized version of the circuit structure of FIG. 2A, according to some embodiments.

FIG. 4A illustrates a block diagram of a circuit structure including a ROM that drives an arithmetic operator, according to some embodiments.

FIG. 4B illustrates a block diagram of an optimized version of the circuit structure of FIG. 4A, according to some embodiments.

FIG. 5A illustrates a block diagram of a circuit structure including a ROM that drives an input of a pipeline register, the pipeline register driving an arithmetic operator, according to some embodiments.

FIG. 5B illustrates a block diagram of the circuit structure of FIG. 5A, after a register retiming process, according to some embodiments.

DETAILED DESCRIPTION

Figure 1:
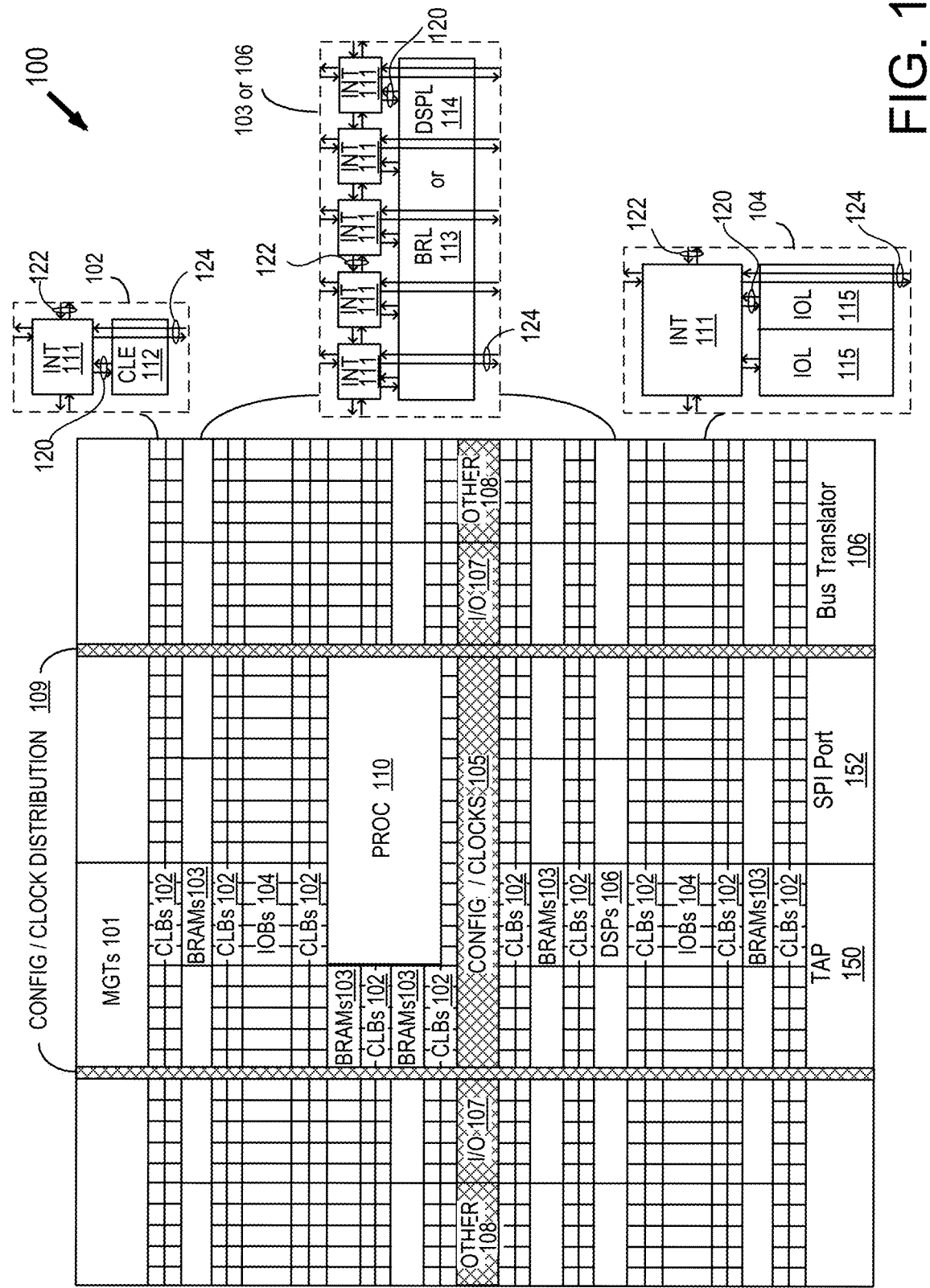
FIG. 1 is a block diagram illustrating an exemplary architecture for an IC according to some embodiments of the present disclosure.

Various embodiments are described hereinafter with reference to the figures, in which exemplary embodiments are shown. The claimed invention may, however, be embodied in different forms and should not be construed as being limited to the embodiments set forth herein. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiments even if not so illustrated, or if not so explicitly described. The features, functions, and advantages may be achieved independently in various embodiments or may be combined in yet other embodiments.

Before describing exemplary embodiments illustratively depicted in the several figures, a general introduction is provided to further understanding.

As discussed above, non-volatile memories (e.g., such as ROMs) have become a critical component of IC designs and may be mapped to look up tables (LUTs) or to dedicated random-access memory blocks (BRAMs). However, using LUTs comes at a cost of using logic cells that may be needed to implement logic circuits, thus LUTs are generally used for smaller memories, while BRAMS may generally be used to instantiate large, registered ROMs. With respect to ROM performance, if a ROM drives an arithmetic operator, or if a ROM address is driven by an arithmetic operator, performance (e.g., maximum operating frequency (FMax)) may be degraded. Also, and in various examples, the amount of IC area occupied by such ROM and arithmetic operator structures may present additional design and/or performance challenges. For integrated circuit (IC) solutions, it has been discovered that an optimized ROM, having its memory content modified based on an arithmetic operator (e.g., to effectively perform the function of the arithmetic operator) while simultaneously removing the separate arithmetic operator, may be employed to address the various area and performance challenges associated with at least some current solutions.

With the above general understanding borne in mind, various embodiments for providing optimization of read-only memory are generally described below. Various advantages may be present in various applications of the present disclosure. No particular advantage is required for all embodiments, and different embodiments may offer different advantages. For example, embodiments discussed herein include systems and methods to collapse arithmetic operators with constant input(s) into a ROM using structural analysis of a data flow graph. Stated another way, various embodiments provide for modifying the contents of memory (e.g., of a ROM) to "absorb" an arithmetic operator into the memory. As used herein, "absorbing" the arithmetic operator may be used to mean modifying the contents of the memory based on the arithmetic operator, for example, such that the contents of the memory have effectively been operated on by the arithmetic operator. Thus, "absorbing" the arithmetic operator may also mean absorbing the function of the arithmetic operator into the ROM. As a result of the memory absorbing the arithmetic operator, and in some embodiments, the arithmetic operator (separate from the ROM, but whose function was absorbed by the ROM) may be removed.

In various examples, the methods disclosed herein may be accomplished when the arithmetic operator has a constant input, as described below. In some cases, the various embodiments disclosed herein may include circumstances where (i) a ROM address input is driven by an arithmetic operator having a constant input (e.g., referred to as input optimizations) and/or where (ii) a ROM output drives an arithmetic operator having a constant input (e.g., referred to as output optimizations). Methods and systems for optimizing a memory, as described herein, may also be subject to cost function analysis, for example, including sparsity computation, as well as memory depth and width (e.g., as part of a decision to map a ROM to a BRAM). Generally, the techniques described herein, and including packing/absorbing surrounding arithmetic logic into a memory (e.g., ROM), provide for improved performance and reduced area. Additional embodiments and advantages are discussed below and/or will be evident to those skilled in the art in possession of this disclosure.

Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

In general, for each of these programmable logic devices ("PLDs"), the functionality of the device is controlled by configuration data provided to the device for that purpose. The configuration data can be stored in volatile memory (e.g., static memory cells, as common in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an exemplary FPGA architecture 100. The FPGA architecture 100 includes a large number of different programmable tiles, including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1. Each programmable interconnect element 111 can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the example of FIG. 1, an area (depicted horizontally) near the center of the die (e.g., formed of regions 105, 107, and 108 shown in FIG. 1) can be used for configuration, clock, and other control logic. Column 109 (depicted vertically) extending from this horizontal area or other columns may be used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, PROC 110 spans several columns of CLBs and BRAMs. PROC 110 can include various components ranging from a single microprocessor to a complete programmable processing system of microprocessor(s), memory controllers, peripherals, and the like.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100, and may be replaced with one or more of the other varieties of the programmable blocks described. Further, such blocks can be utilized to form a "soft processor" in that the various blocks of programmable circuitry can be used to form a processor that can execute program code, as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 can be considered programmable circuitry of the IC.

In some embodiments, the functionality and connectivity of programmable circuitry are not established until configuration data is loaded into the IC. A set of configuration data can be used to program programmable circuitry of an IC such as an FPGA. The configuration data is, in some cases, referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

In some embodiments, circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual IC, more than one adjacent row of CLBs is typically included wherever the CLBs appear, to facilitate the efficient implementation of user logic, but the number of adjacent CLB rows varies with the overall size of the IC. Moreover, the FPGA of FIG. 1 illustrates one example of a programmable IC that can employ examples of the interconnect circuits described herein. The interconnect circuits described herein can be used in other types of programmable ICs, such as CPLDs or any type of programmable IC having a programmable interconnect structure for selectively coupling logic elements.

It is noted that the ICs that may implement the methods and systems for ROM optimization are not limited to the exemplary IC depicted in FIG. 1, and that ICs having other configurations, or other types of ICs, may also implement the methods and systems for ROM optimization.

Referring first to input optimizations, reference is made to the example of FIG. 2A, which illustrates a block diagram 200 of a circuit structure including an arithmetic operator 202 that drives an address input of a ROM 204, and where the arithmetic operator 202 has a constant input. In various embodiments, the arithmetic operator 202 may include an adder, a subtractor, a multiplier, a divider, or other type of arithmetic operator. The arithmetic operator 202 thus physically implements a mathematical function, for example, by performing the prescribed arithmetic operation on operands provided as inputs to the arithmetic operator 202.

In some embodiments, the arithmetic operator 202 includes a first input 206 and a second input 208. In some examples, the first input 206 is a constant input. Stated another way, the first input 206 provides a constant value (constant operand) at the first input 206 of the arithmetic operator 202. In some cases, the constant value may include a positive integer, a negative integer, zero, or other appropriate constant value. In some embodiments, the second input 208 includes an output of input logic 210 that is coupled to the second input 208. In some cases, the input logic 210 may include a portion of a data pipeline, for example, including combinational logic, register(s), or other appropriate elements. Generally, as used herein, a data pipeline may include a set of data processing elements connected in series, where the output of one processing element is the input of the next processing element. Thus, in the present example, the arithmetic operator 202 and the ROM 204 may likewise provide a portion of the data pipeline. In some cases, the elements of a pipeline are often executed in parallel or in time-sliced fashion. In some examples, an amount of buffer storage may be inserted between processing elements. In some embodiments, the data pipeline may include an instruction pipeline, a graphics pipeline, or a software pipeline, among others.

As noted above, the arithmetic operator 202, having a constant value at the first input 206, drives an address input 205 of the ROM 204. By way of example, the ROM 204 may include a decoder and a memory array (e.g., such as a two-dimensional array of bit cells). In some embodiments, the decoder may be used to decode the address input 205, and data may be read from the memory array based on the decoded address input 205. Generally, an M-bit data value may be read or written at each unique N-bit address of the ROM 204. In some examples, the memory array thus may include $2^N$ rows and M columns, where a depth of the memory array is defined as a number of rows (number of words) of the memory array, a width of the memory array is defined as a number of columns (size of word) of the memory array, and a size of the memory array is defined as depth×width=$2^N$×M. In some embodiments, the data that has been read from the memory array may be provided as an input 207 to a pipeline register 212. In various examples, the pipeline register 212 may be part of the data pipeline, as described above. By way of example, data values intended for use in later stages of the data pipeline may be propagated through pipeline registers (e.g., such as the pipeline register 212). In some embodiments, such pipeline registers may also be used to propagate control signal values to later stages of the data pipeline.

The circuit structure of the block diagram 200, where the arithmetic operator 202 drives an address input 205 of the ROM 204, may result in degraded circuit performance (e.g., such as degraded FMax), as discussed above. In some embodiments, an input optimization may be performed to absorb or collapse the function of the arithmetic operator 202 into the ROM 204 (while the arithmetic operator 202 itself is removed from the circuit) to provide the optimized circuit structure of block diagram 250 of FIG. 2B. Such input optimization, discussed in more detail with reference to FIG. 3 below, may be accomplished by modifying the contents of the ROM 204 based on the arithmetic operator 202 to provide an updated ROM 204'. For avoidance of doubt, the ROM 204 and the updated ROM 204' may include the same physical device structure that have different contents stored within their respective memory arrays. By way of example and referring to the optimized circuit structure of the block diagram 250, the input logic 210 may thus drive the address input 205 of the updated ROM 204', and data read from the memory array of the updated ROM 204' may be provided as the input 207 to the pipeline register 212. Further, by absorbing or collapsing the arithmetic operator 202 into the ROM 204 (FIG. 2A) to provide the updated ROM 204', the arithmetic operator 202 itself may be removed, as shown in FIG. 2B. As a result, the optimized circuit structure of the block diagram 250 may provide improved circuit performance (e.g., improved FMax), while also occupying a smaller circuit area.

Figure 3:
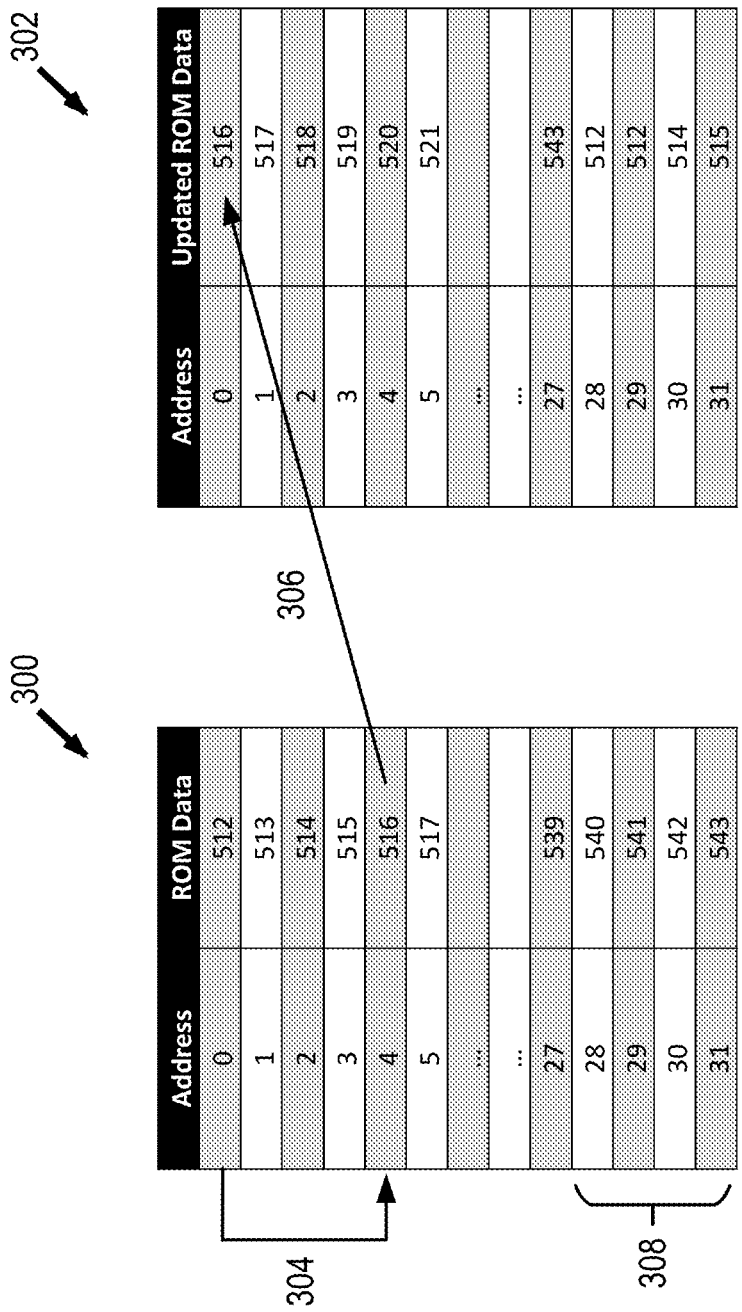
FIG. 3 illustrates tables including address and data information for an exemplary ROM, before and after an optimization process, according to some embodiments.

With reference to FIG. 3, illustrated therein is a table 300 and a table 302 including address and data information for an exemplary 32-deep ROM (e.g., having 32 rows). In the present example, the table 300 may correspond to the ROM 204 (FIG. 2A), and the table 302 may correspond to the updated ROM 204' (FIG. 2B), which as noted above may include the same physical device structure having different contents stored within their respective memory arrays. As shown, the table 300 includes an 'Address' column and a 'ROM Data' column, and the table 302 includes the 'Address' column and an 'Updated ROM Data' column. For each of the tables 300, 302, the 'Address' column includes addresses 0 through 31, corresponding to the 32 words stored in the ROM 204 and the ROM 204', respectively. By way of example, the 'ROM Data' column of the table 300 may include a data value stored for each corresponding unique address of the ROM 204, and the 'Updated ROM Data' column of the table 302 may include an updated data value stored for each corresponding unique address of the updated ROM 204'. While the present example is discussed with reference to 32-deep ROM, it will be understood that the various embodiments are not limited to this type of memory configuration, and in some embodiments other ROM configurations (e.g., having a variety of depths and widths) may equally be used without departing from the scope of the present disclosure.

Elaborating on examples of the tables 300, 302, consider the circuit structure of the block diagram 200 that includes the arithmetic operator 202, where the arithmetic operator 202 includes an adder and the first input 206 (the constant input) provides a constant value of four (4). Thus, the address input 205 (driven by the arithmetic operator 202) provided to the ROM 204 will be offset or shifted by a constant value of four (4). For example, when 'Address'=0, the ROM 204 output will include the 'ROM Data' at 'Address'=4. The arithmetic operator 202 thus changes the output of the memory, but the address space remains the same. As such, to generate the 'Updated ROM Data' for the table 302, the 'Address' value is first incremented by four (4) (e.g., from 'Address'=0 to 'Address'=4, as indicated by arrow 304), and the 'ROM Data'=516 at address location 'Address'=4 is then fetched and stored at address location 'Address'=0 (as indicated by arrow 306) to provide 'Updated ROM Data' at address location 'Address'=0 for the table 302. Stated another way, the 'ROM Data' value=512 at 'Address'=0 (table 300) is replaced by the 'Updated ROM Data' value=516 at 'Address'=0 (table 302). Since the entire address space (e.g., addresses 0 through 31) is shifted by the constant value four (4), a similar procedure to that described above may be followed in order to generate the 'Updated ROM Data' values for each unique 'Address' value and thus provide a complete updated ROM table (e.g., the table 302).

It is noted that for some address locations 308, incrementing the 'Address' value by four (4) would provide values that are out of range of the entire address space. For example, incrementing 'Address' values 28, 29, 30, 31 by four (4) would result in out of range 'Address' values 32, 33, 34, 35. In such a circumstance, the out of range 'Address' values may wrap around to the beginning of the address space. For instance, out of range 'Address' values 32, 33, 34, 35 may in some cases become 'Address' values 0, 1, 2, 3. As such, in some embodiments, the 'ROM Data'=512, 513, 514, 515 at 'Address' values=0, 1, 2, 3 may be fetched and stored at 'Address' values=28, 29, 30, 31 to provide respective a portion of the 'Updated ROM Data'.

Thus, by providing the updated ROM 204' (e.g., having the corresponding 'Updated ROM Data' of table 302), the function of the arithmetic operator 202 (e.g., shifting the addresses by a constant value of four (4)) has effectively already been performed. Thus, the arithmetic operator 202 may be removed to provide the optimized circuit structure of FIG. 2B. Stated another way, the arithmetic operator 202 has been optimized away. For the exemplary case of FPGAs, such input optimizations may provide for a reduction in LUTs and Carry logic, for example, at a ROM input and thereby improve performance (e.g., FMax) and reduce circuit area.

Referring now to output optimizations, reference is made to FIG. 4A, which illustrates a block diagram 400 of a circuit structure including a ROM 404 that drives an arithmetic operator 402, and where the arithmetic operator 402 has a constant input. In some embodiments, the arithmetic operator 402 may be substantially the same as the arithmetic operator 202, and the ROM 404 may be substantially the same as the ROM 204, both described above with reference to FIG. 2A.

In some embodiments, the arithmetic operator 402 includes a first input 406 and a second input 408. Similar to the example described above with reference to FIG. 2A, the first input 406 is a constant input, which provides a constant value (constant operand) at the first input 406 of the arithmetic operator 402. In some embodiments, the second input 408 may include an output of the ROM 404. Thus, data that has been read from the memory array of the ROM 404 may be provided to the second input 408. In some cases, input logic 410, similar to the input logic 210 described above, may be coupled to an address input 405 of the ROM 404 and may include a portion of a data pipeline, for example, including combinational logic, register(s), or other appropriate elements. In some embodiments, an output of the arithmetic operator 402 may be provided as an input 407 to a pipeline register 412. In various examples, the pipeline register 412 may be similar to the pipeline register 212, described above.

The circuit structure of the block diagram 400, where the ROM 404 drives the arithmetic operator 402, may result in degraded circuit performance, as discussed above. In some embodiments, an output optimization may be performed to absorb or collapse the function of the arithmetic operator 402 into the ROM 404, to provide the optimized circuit structure of block diagram 450 of FIG. 4B. Similar to the input optimization discussed above, the output optimization may be accomplished by modifying the contents of the ROM 404 based on the arithmetic operator 402 to provide an updated ROM 404'. For example, in various embodiments, the output of the arithmetic operator 402 (e.g., input 407 to the pipeline register 412) may be equivalent to modifying each word of the memory array of the ROM 404 by the arithmetic operator 402 (e.g., by the function of the arithmetic operator 402) to provide the updated ROM 404'. By way of example and referring to the optimized circuit structure of the block diagram 450, the input logic 410 may thus drive the address input 405 of the updated ROM 404', and data read from the memory array of the updated ROM 404' may be provided as the input 407 to the pipeline register 412. Further, by absorbing or collapsing the arithmetic operator 402 into the ROM 404 (FIG. 4A) to provide the updated ROM 404', the arithmetic operator 402 itself may be removed, as shown in FIG. 4B. As a result, the optimized circuit structure of the block diagram 450 may provide improved circuit performance (e.g., improved FMax), while also occupying a smaller circuit area. In some examples, the present output optimization in particular provides a performance advantage when a ROM output or address is registered.

In the above example of FIG. 4A, the block diagram 400 illustrated a circuit having a structure configured generally as ROM→arithmetic operator→pipeline register. In some alternative implementations, the arithmetic operator may not appear in the circuit structure immediately following the ROM. For instance, the example of FIG. 5A illustrates a circuit having a structure configured generally as ROM→pipeline register→arithmetic operator→pipeline register. At least some of the elements discussed with reference to FIG. 5A are substantially the same as elements discussed with reference to FIG. 4A, thus like reference numerals are used for clarity of discussion. For example, FIG. 5A illustrates a block diagram 500 of a circuit structure including the ROM 404 that drives an input 409 of a pipeline register 414, the pipeline register 414 driving the arithmetic operator 402 (which has a constant input). The arithmetic operator 402 includes the first input 406 (constant input) and the second input 408. The second input 408 may include an output of the pipeline register 414. Input logic 410 is coupled to the address input 405 of the ROM 404. In some embodiments, the output of the arithmetic operator 402 may be provided as the input 407 to the pipeline register 412.

In some embodiments, prior to performing the output optimization of the circuit structure of the block diagram 500, the pipeline register 414 may be retimed to provide the circuit structure of block diagram 525 of FIG. 5B. Generally, register retiming is a circuit optimization technique that moves registers forward or backward across combinational elements in a circuit. In some embodiments, register retiming may be performed to shorten the clock cycle or reduce circuit area. In the present example, retiming of the pipeline register 414 may be performed as a preliminary step to the ROM optimization process, described herein. Referring to FIGS. 5A and 5B, the forward retiming of the pipeline register 414 moves the pipeline register 414 such that the ROM 404 now drives the arithmetic operator 402 (which has the constant input), the arithmetic operator 402 now drives the retimed pipeline register 414, and the pipeline register 414 now drives the pipeline register 412. It is noted that after the forward retiming of the pipeline register 414, the second input 408 may include the output of the ROM 404.

Figure 5C:
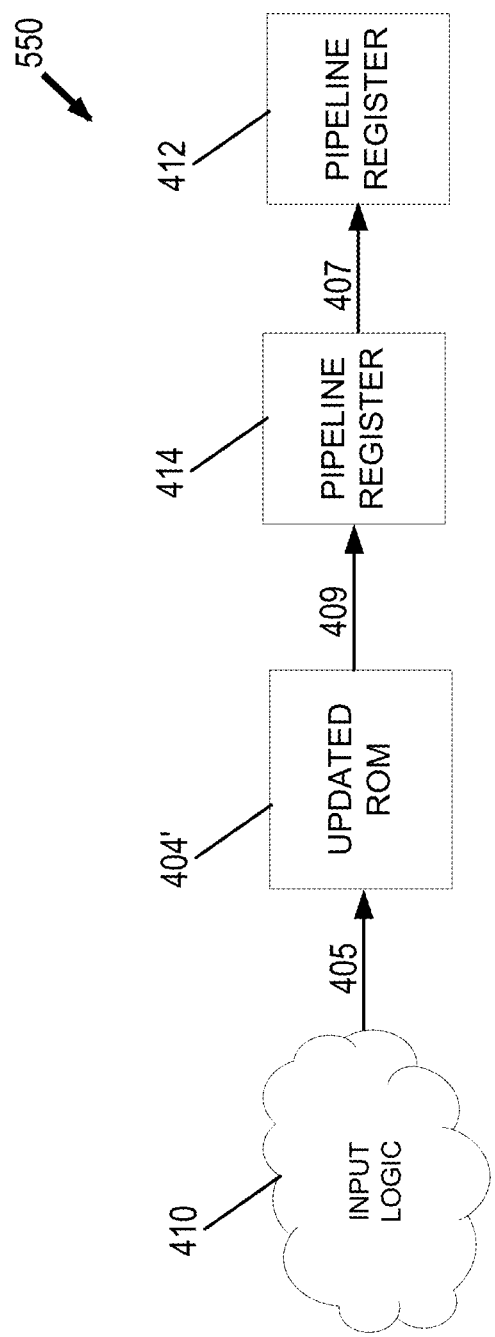
FIG. 5C illustrates a block diagram of an optimized version of the circuit structure of FIG. 5B, according to some embodiments.

After performing the register retiming, and in various embodiments, the output optimization may be performed (to the circuit structure of the block diagram 525) to absorb or collapse the function of the arithmetic operator 402 into the ROM 404, to provide the optimized circuit structure of block diagram 550 of FIG. 5C. As previously discussed, the output optimization is accomplished by modifying the contents of the ROM 404 based on the arithmetic operator 402 to provide the updated ROM 404'. Referring to the optimized circuit structure of the block diagram 550, the input logic 410 may thus drive the address input 405 of the updated ROM 404', and data read from the memory array of the updated ROM 404' may be provided as the input 409 to the retimed pipeline register 414. Further, by absorbing or collapsing the arithmetic operator 402 into the ROM 404 (FIG. 5B) to provide the updated ROM 404', the arithmetic operator 402 itself may be removed, as shown in FIG. 5C. Thus, the optimized circuit structure of the block diagram 550 may provide improved circuit performance and occupy a smaller circuit area. Moreover, in some embodiments, the optimizations discussed herein may provide for better packing of pipeline registers while also not requiring glue logic (e.g., between the updated ROM 404' and the pipeline register 414).

While the example discussed above with reference to FIGS. 5A-5C began with a circuit having the structure of FIG. 5A and configured generally as ROM→pipeline register→arithmetic operator→pipeline register, it will be understood that other configurations are possible, while remaining within the scope of the present disclosure. For instance, the register retiming and output optimization processes described herein may generally be applied when a ROM drives any number of a plurality of sequential pipeline registers followed by an arithmetic operator. As such, regardless of the number of pipeline registers in the data pipeline between the ROM and the arithmetic operator, at the output side of the ROM, one or more forward register retiming processes may be performed until the ROM directly drives the arithmetic operator, after which the output optimization process may be performed.

Moreover, in some embodiments, the register retiming and optimization processes described above may similarly be applied to input optimizations, as discussed with reference to FIGS. 2A, 2B, and 3. In the example of FIG. 2A, the block diagram 200 illustrates a circuit structure where the arithmetic operator 202 directly drives the address input of the ROM 204. However, in some cases, the arithmetic operator may not appear in the circuit structure immediately before the ROM. For example, in some cases, a circuit may have a structure configured as arithmetic operator→pipeline register→ROM. In such an example, a backward retiming of the pipeline register may first be performed to reconfigure the structure as pipeline register→arithmetic operator→ROM, such that the arithmetic operator directly drives the address input of the ROM. After performing the backward register retiming, the input optimization process may proceed, as previously discussed. Generally, with respect to input optimizations, an arithmetic operator may drive any number of a plurality of sequential pipeline registers followed by the ROM. As such, regardless of the number of pipeline registers in the data pipeline between the arithmetic operator and the ROM, at the input side of the ROM, one or more backward register retiming processes may be performed until the arithmetic operator directly drives the address input of the ROM, after which the input optimization process may be performed.

Figure 6:
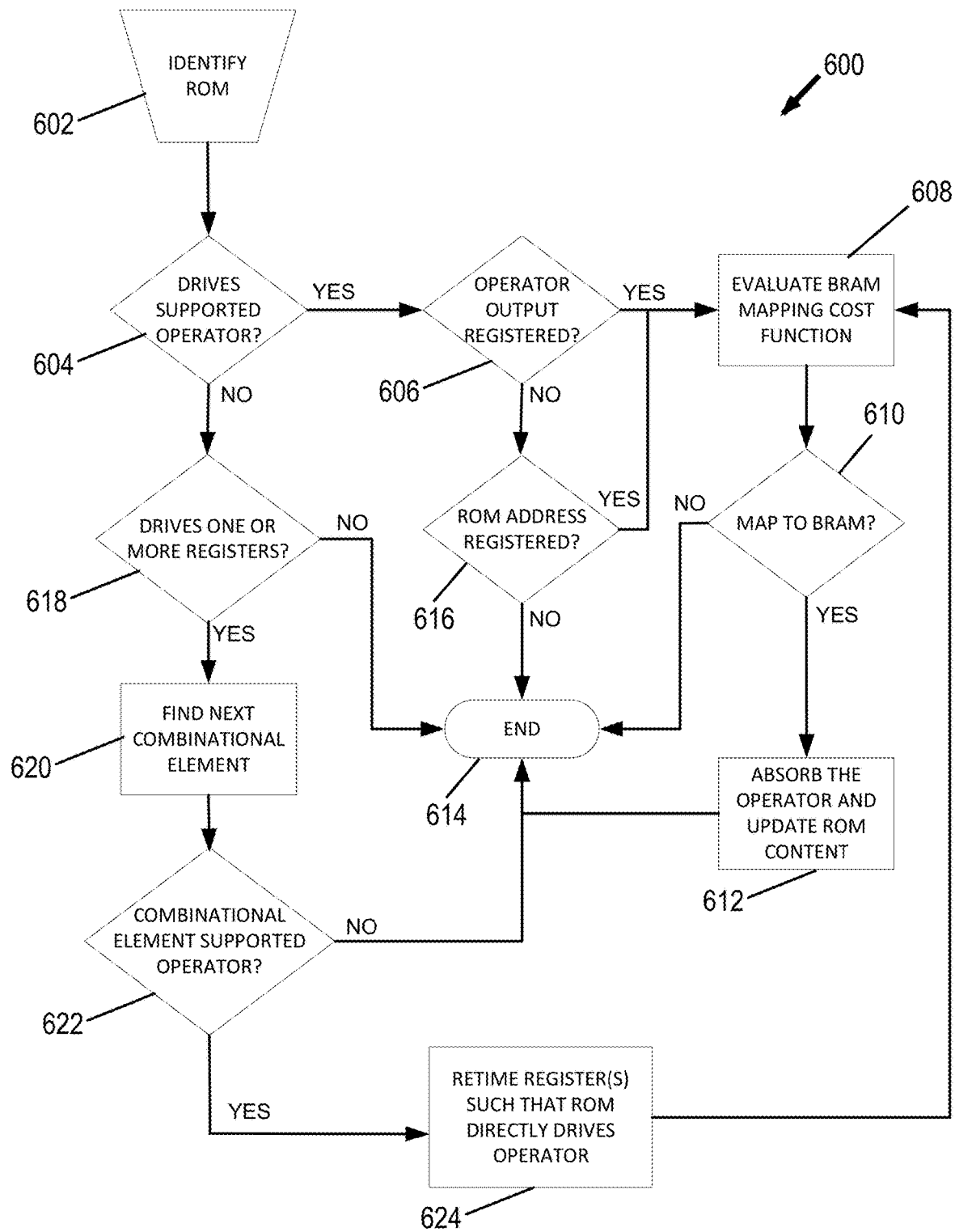
FIG. 6 provides a flowchart that illustrates a method for ROM output optimization, according to various embodiments.
Figure 7:
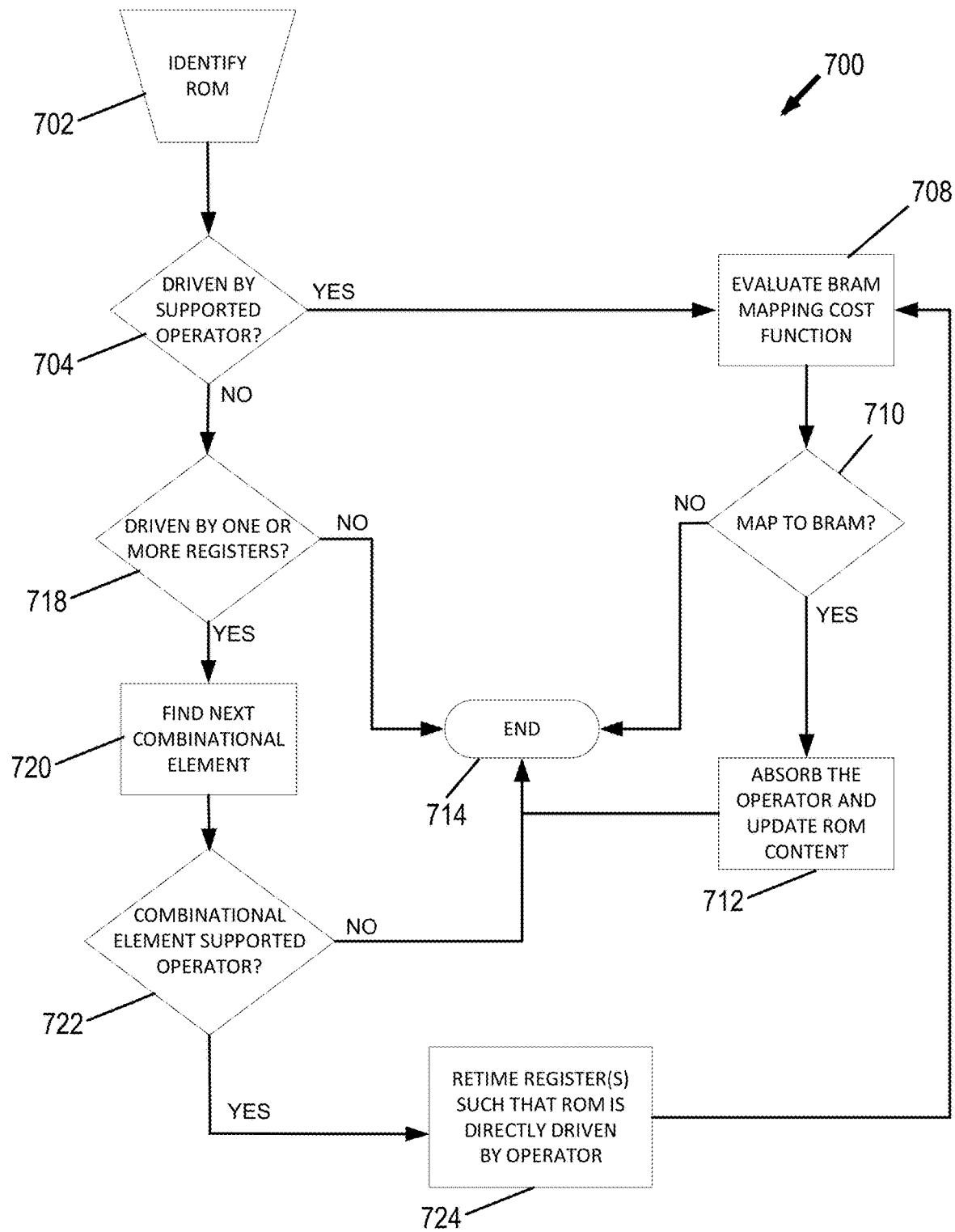
FIG. 7 provides a flowchart that illustrates a method for ROM input optimization, according to various embodiments.

In view of the above discussion, reference is now made to the example of FIGS. 6 and 7, which illustrate methods 600 and 700 for output optimization and input optimization, respectively, according to various embodiments. It is understood that additional operations can be provided before, during, and after the methods 600 and 700, and some operations described can be replaced, eliminated, or moved around for additional embodiments of the methods. It is also noted that the methods 600 and 700 are exemplary and are not intended to limit the present disclosure beyond what is explicitly recited in the claims that follow.

Referring first to the output optimization method of FIG. 6, the method 600 will be described in conjunction with FIGS. 4A, 4B, 5A, 5B, and 5C, previously discussed. The method 600 begins at block 602 where a ROM is identified. For example, in an embodiment of block 602, the ROM 404 (FIGS. 4A, 5A) may be identified within the given circuit structure or design. For avoidance of doubt, block 602 may include identifying any number of a plurality of ROMs in a given circuit design. In various embodiments, and for each ROM identified, structural analysis is performed to identify qualifying patterns. For example, structural analysis of at least a portion of the data pipeline (e.g., including the ROM and one or more adjacent processing elements) may be performed to identify qualifying patterns. In some embodiments, a qualifying pattern may include (i) ROM→arithmetic operator→pipeline register; (ii) ROM→pipeline register→arithmetic operator→pipeline register; or (iii) another appropriate pattern.

After identification of ROMs and qualifying patterns (block 602), the method 600 proceeds to block 604 where it is determined whether an identified ROM drives a supported arithmetic operator. In some examples, supported arithmetic operators include adders, subtractors, multipliers, or dividers which have a constant input, as described above. If the identified ROM drives a supported operator (block 604; e.g., FIG. 4A), the method 600 proceeds to block 606 where it is determined whether an output of the supported operator is registered. If the output of the supported operator is registered (block 606), then the method 600 proceeds to block 608 where a BRAM mapping cost function is evaluated.

For example, updated contents of the memory array of the ROM may be computed (e.g., by applying the function of the arithmetic operator to each word of the memory array). In some examples, the depth of the memory remains unchanged; however, the width of the memory may change. In some embodiments, the cost function of mapping the updated memory to BRAM includes a heuristic approach to identify which memories are better mapped to BRAMs as opposed to LUTs. In some cases, cost function inputs include width of the updated memory content, depth of the updated memory content, and sparseness of the updated memory content. In some examples, sparse memories (e.g., having a lot of zeros in memory content) are better mapped to LUTs. Also, if memory size is too small, mapping to BRAM may not provide a desired performance advantage.

After evaluation of the BRAM mapping cost function (block 608), the method 600 proceeds to block 610 where a decision is made whether to map the memory to BRAM (e.g., based on the results of the BRAM mapping cost function). If it is determined that the memory should be mapped to BRAM (block 610), then the method 600 proceeds to block 612 where the arithmetic operator is absorbed, and the content of the ROM memory array is updated, for example, to provide the updated ROM (e.g., FIGS. 4B, 5C), and the method 600 ends (block 614). If it is determined that the memory should not be mapped to BRAM (block 610), then the method 600 ends (block 614).

At block 606, if the output of the supported operator is not registered, then the method 600 proceeds to block 616 where it is determined whether a ROM address is registered (e.g., ROM identified at block 602). If the ROM address is registered (block 616), then the method 600 proceeds to block 608 where the BRAM mapping cost function is evaluated, as described above. If it is determined that the ROM address is not registered (block 616), then the method 600 ends (block 614).

Returning to block 604, if the identified ROM does not drive a supported operator (e.g., FIG. 5A), the method 600 proceeds to block 618 where it is determined whether the identified ROM drives one or more registers. If the identified ROM does not drive one or more registers, then the method 600 ends (block 614). If the identified ROM does drive one or more registers, then the method 600 proceeds to block 620 where a next combinational element is found. For example, a structural analysis may be performed to identify the first combinational element at the output of the one or more registers driven by the ROM. After identifying the first combinational element (block 620), the method 600 proceeds to block 622 where it is determined whether the first combinational element includes a supported arithmetic operator. If the first combinational element does not include a supported arithmetic operator (block 622), then the method 600 ends (block 614). If the first combinational element does include a supported arithmetic operator (block 622), then the method 600 proceeds to block 624 where retiming of the one or more registers may be performed such that the ROM directly drives the supported arithmetic operator (e.g., FIG. 5A, 5B). In some embodiments, the retiming may include forward retiming of registers (e.g., pipeline register 414) to move the arithmetic operator (e.g., arithmetic operator 402) to the output of the ROM (e.g., ROM 404). After performing retiming (block 624), the method 600 proceeds to block 608 where the BRAM mapping cost function is evaluated. As discussed above, if it is determined that it is better to map the memory to a BRAM (e.g., as opposed to a LUT), then the arithmetic operator may be absorbed or collapsed into the ROM (e.g., by altering contents of the memory array according to the arithmetic operator). For the exemplary case of FPGAs, the output optimizations discussed herein may provide for a reduction in LUTs and Carry logic, for example, at a ROM output and thereby improve performance (e.g., FMax) and reduce circuit area.

Referring now to the input optimization method to FIG. 7, the method 700 will be described partly in conjunction with FIGS. 2A and 2B, previously discussed. In addition, some of the operations discussed with reference to the method 700 may be similar to operations discussed above with reference to the method 600, thus for clarity of discussion, some aspects of the method 700 are only discussed briefly. The method 700 begins at block 702 where a ROM is identified. For example, in an embodiment of block 702, the ROM 204 (e.g., FIG. 2A) may be identified within the given circuit structure or design. For avoidance of doubt, block 702 may include identifying any number of a plurality of ROMs in a given circuit design. In various embodiments, and for each ROM identified, structural analysis is performed to identify qualifying patterns. For example, structural analysis of at least a portion of the data pipeline (e.g., including the ROM and one or more adjacent processing elements) may be performed to identify qualifying patterns. In some embodiments, a qualifying pattern may include (i) arithmetic operator→ROM; (ii) arithmetic operator→pipeline register→ROM; or (iii) another appropriate pattern.

After identification of ROMs and qualifying patterns (block 702), the method 700 proceeds to block 704 where it is determined whether an identified ROM is driven by a supported arithmetic operator (e.g., adders, subtractors, multipliers, or dividers which have a constant input). If the identified ROM is driven by a supported operator (block 704; e.g., FIG. 2A), the method 700 proceeds to block 708 where a BRAM mapping cost function is evaluated, in a similar manner as discussed above.

After evaluation of the BRAM mapping cost function (block 708), the method 700 proceeds to block 710 where a decision is made whether to map the memory to BRAM (e.g., based on the results of the BRAM mapping cost function). If it is determined that the memory should be mapped to BRAM (block 710), then the method 700 proceeds to block 712 where the arithmetic operator is absorbed, and the content of the ROM memory array is updated, for example, to provide the updated ROM (e.g., FIG. 2B), and the method 700 ends (block 714). If it is determined that the memory should not be mapped to BRAM (block 710), then the method 700 ends (block 714).

As previously noted, and in some cases, the arithmetic operator may not appear in the circuit structure immediately before the ROM (e.g., driving the ROM). Thus, returning to block 704, if the identified ROM is not driven by a supported operator, the method 700 proceeds to block 718 where it is determined whether the identified ROM is driven by one or more registers. If the identified ROM is not driven by one or more registers, then the method 700 ends (block 714). If the identified ROM is driven by one or more registers, then the method 700 proceeds to block 720 where a next combinational element is found. For example, a structural analysis may be performed to identify the first combinational element at the input of the one or more registers that drive the ROM. After identifying the first combinational element (block 720), the method 700 proceeds to block 722 where it is determined whether the first combinational element includes a supported arithmetic operator. If the first combinational element does not include a supported arithmetic operator (block 722), then the method 700 ends (block 714). If the first combinational element does include a supported arithmetic operator (block 722), then the method 700 proceeds to block 724 where retiming of the one or more registers may be performed such that the ROM is directly driven by the supported arithmetic operator. In some embodiments, the retiming may include backward retiming of pipeline registers, as discussed above, to move the arithmetic operator to the input of the ROM (e.g., ROM 204). After performing retiming (block 724), the method 700 proceeds to block 708 where the BRAM mapping cost function is evaluated. As discussed above, if it is determined that it is better to map the memory to a BRAM (e.g., as opposed to a LUT), then the arithmetic operator may be absorbed or collapsed into the ROM (e.g., by altering contents of the memory array according to the arithmetic operator). For the exemplary case of FPGAs, the input optimizations discussed herein may provide for a reduction in LUTs and Carry logic, for example, at a ROM input and thereby improve performance (e.g., FMax) and reduce circuit area.

It is noted that various circuit structures and configurations illustrated in the figures are exemplary only and are not intended to be limiting beyond what is specifically recited in the claims that follow. In addition, it is noted that the input and output optimizations discussed herein may be performed independently or in conjunction with one another. Further, any number of optimizations (input and/or output) may be performed, for example, based on the number of ROMs, supported arithmetic operators, and qualifying patterns found in a given circuit structure. Also, in at least some embodiments, the input and/or output optimizations disclosed herein may be performed during a synthesis portion of an RTL design flow. It will be understood by those skilled in that art in possession of this disclosure that other circuit structures, configurations, and/or methods may also be used.

Although particular embodiments have been shown and described, it will be understood that it is not intended to limit the claimed inventions to the preferred embodiments, and it will be obvious to those skilled in the art that various changes and modifications may be made without departing from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. A memory optimization method, comprising:
identifying, within a circuit design, a memory having an arithmetic operator at an output side of the memory, wherein a first input of the arithmetic operator includes a constant value; and
absorbing a function of the arithmetic operator into the memory, wherein the absorbing the function includes:
modifying contents of the memory based on the function of the arithmetic operator to provide an updated memory; and
removing the arithmetic operator from the circuit design.

2. The memory optimization method of claim 1,
wherein the identifying further includes identifying that the memory drives a second input of the arithmetic operator.

3. The memory optimization method of claim 1,
wherein the identifying further includes identifying that the memory drives one or more registers and identifying that the one or more registers drive a second input of the arithmetic operator.

4. The memory optimization method of claim 3, further comprising:
based on the identifying, performing a forward retiming of the one or more registers to modify the circuit design so that the memory drives the second input of the arithmetic operator; and
after the performing the forward retiming, absorbing the function of the arithmetic operator into the memory.

5. The memory optimization method of claim 1, further comprising:
determining whether an output of the arithmetic operator is registered or whether an address of the memory is registered.

6. The memory optimization method of claim 5, further comprising:
based on the determining, evaluating a memory mapping cost function, wherein the memory mapping cost function is determined based on a width of the updated memory, a depth of the updated memory, and a sparseness of the updated memory.

7. The memory optimization method of claim 6, further comprising:
based on the evaluating the memory mapping cost function, mapping the updated memory to a dedicated random-access memory block (BRAM), wherein the mapping the updated memory to the BRAM includes absorbing the function of the arithmetic operator into the memory.

8. A memory output optimization method, comprising:
identifying a circuit design including a data pipeline having a first stage that includes a read-only memory (ROM) and a second stage that includes an arithmetic operator, wherein the arithmetic operator has a first input that includes a constant value, and wherein the second stage is disposed at an output side of the first stage;
modifying each word of a memory array of the ROM based on a function of the arithmetic operator to provide an updated ROM; and
removing the arithmetic operator from the circuit design.

9. The memory output optimization method of claim 8,
wherein the identifying further includes identifying the data pipeline having a third stage disposed between the first stage and the second stage, wherein the third stage includes a register, and wherein the register drives a second input of the arithmetic operator.

10. The memory output optimization method of claim 9, further comprising:
based on the identifying, performing a forward retiming of the register to modify the circuit design so that the ROM drives the second input of the arithmetic operator; and
after the performing the forward retiming, modifying each word of the memory array of the ROM and removing the arithmetic operator from the circuit design.

11. The memory output optimization method of claim 10,
wherein the forward retiming further modifies the circuit design so that the arithmetic operator drives the register; and
wherein the removing the arithmetic operator from the circuit design further includes modifying the circuit design so that the updated ROM drives the register.

12. The memory output optimization method of claim 10, further comprising:
after the performing the forward retiming and before the modifying each word of the memory array of the ROM, evaluating a memory mapping cost function.

13. The memory output optimization method of claim 12,
wherein the memory mapping cost function is determined based on a width of the updated ROM, a depth of the updated ROM, and a sparseness of the updated ROM.

14. The memory output optimization method of claim 12, further comprising:
based on the evaluating the memory mapping cost function, mapping the updated ROM to a dedicated random-access memory block (BRAM).

15. A memory input optimization method, comprising:
identifying a data pipeline within a circuit design, wherein the data pipeline includes an arithmetic operator at an input side of a read-only memory (ROM), and wherein a first input of the arithmetic operator includes a constant value; and
absorbing a function of the arithmetic operator into the ROM, wherein the absorbing the function includes:
modifying contents of the ROM based on the function of the arithmetic operator to provide an updated ROM; and
removing the arithmetic operator from the data pipeline.

16. The memory input optimization method of claim 15,
wherein the identifying further includes identifying that the arithmetic operator drives an address input of the ROM.

17. The memory input optimization method of claim 15,
wherein the identifying further includes identifying that the arithmetic operator drives one or more registers and identifying that the one or more registers drive an address input of the ROM.

18. The memory input optimization method of claim 17, further comprising:
based on the identifying, performing a backward retiming of the one or more registers to modify the circuit design so that the arithmetic operator drives the address input of the ROM; and
after the performing the backward retiming, absorbing the function of the arithmetic operator into the ROM.

19. The memory input optimization method of claim 15,
wherein the modifying the contents of the ROM further includes shifting an address location by the constant value to a shifted address location;

wherein the modifying the contents of the ROM further includes retrieving data from the shifted address location; and storing the retrieved data into the address location.

20. The memory input optimization method of claim 15, further comprising:

before the absorbing the function of the arithmetic operator into the ROM, evaluating a memory mapping cost function, wherein the memory mapping cost function is determined based on a width of the updated ROM, a depth of the updated ROM, and a sparseness of the updated ROM.

* * * * *